United States Patent [19]

Ih

[11] 4,210,803
[45] Jul. 1, 1980

[54] METHOD AND APPARATUS FOR SIGNAL TRANSMISSION VIA AN OPTICAL FIBER

[75] Inventor: Charles C. Ih, Newark, Del.

[73] Assignee: University of Delaware, Newark, Del.

[21] Appl. No.: 20,750

[22] Filed: Mar. 15, 1979

[51] Int. Cl.² .............................................. H04B 9/00
[52] U.S. Cl. .................................. 455/610; 350/96.14
[58] Field of Search ...................... 250/199; 350/96.14

[56] References Cited

U.S. PATENT DOCUMENTS

| 3,920,983 | 11/1975 | Schlafer | 250/199 |
|---|---|---|---|
| 3,962,657 | 6/1976 | Redman | 250/199 |
| 3,975,628 | 8/1976 | Graves | 250/199 |
| 4,033,882 | 7/1977 | Fletcher | 250/199 |
| 4,063,084 | 12/1977 | Goodwin | 250/199 |
| 4,146,783 | 3/1979 | Desbois | 250/199 |
| 4,156,135 | 5/1979 | Miller | 250/199 |

*Primary Examiner*—Howard W. Britton

[57] ABSTRACT

Method and apparatus for signal transmission via an optical fiber transmission line comprising providing a first substantially monochromatic beam of radiation reserved as a carrier radiation beam, providing a second substantially monochromatic beam of radiation of preselected different frequency than the first substantially monochromatic beam of radiation frequency-interlocked with the first beam of radiation to a preselected degree dependent upon the transmission service to be effected reserved as an information radiation beam, imposing an electrical signal to be transmitted upon the information radiation beam, thereby responsively modulating the information radiation beam, combining the carrier radiation beam and the modulated information radiation beam, transmitting the combined radiation via the optical fiber transmission line to a preselected destination, and detecting the combined radiation with a square law detector to thereby obtain a subcarrier signal constituting the difference in frequency between the carrier radiation beam and the information radiation beam upon which the electrical signal is modulated as the beat frequency of the carrier radiation beam and the modulated information radiation beam, and demodulating to reconstitute the original electrical signal.

14 Claims, 10 Drawing Figures

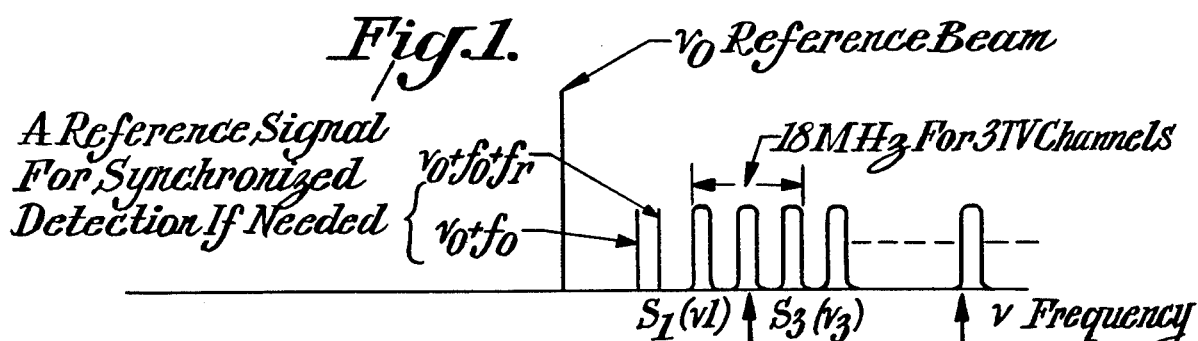
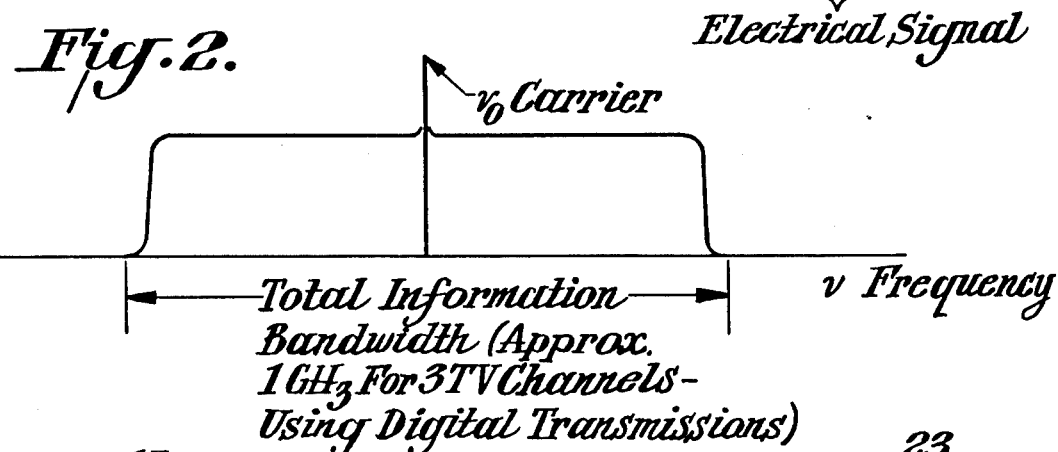
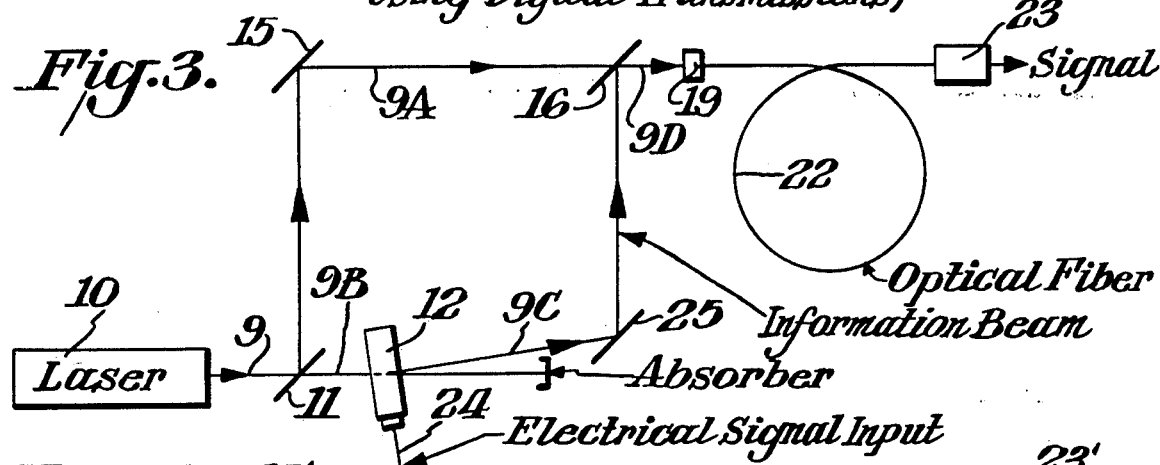
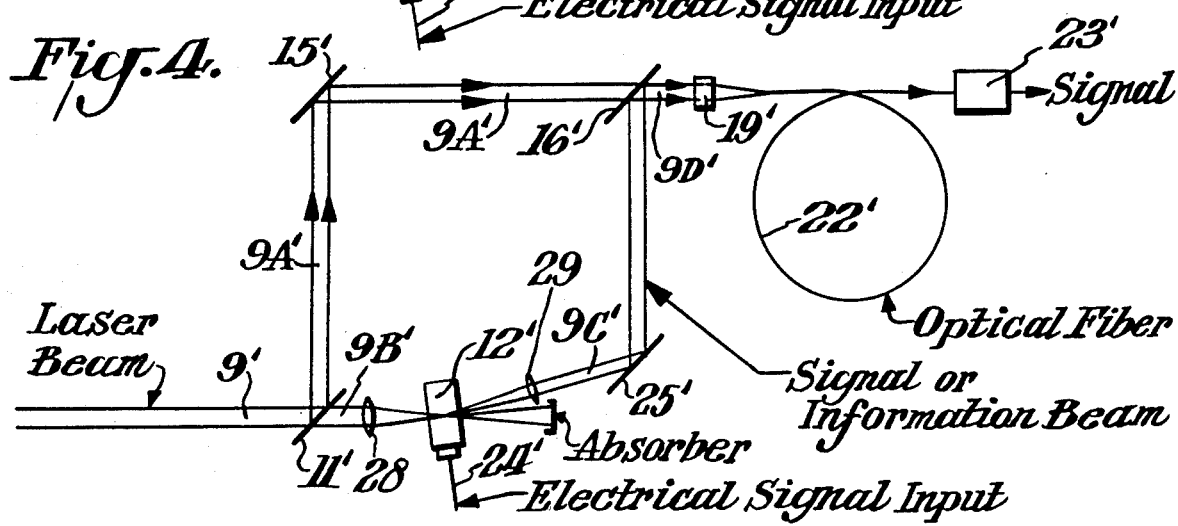

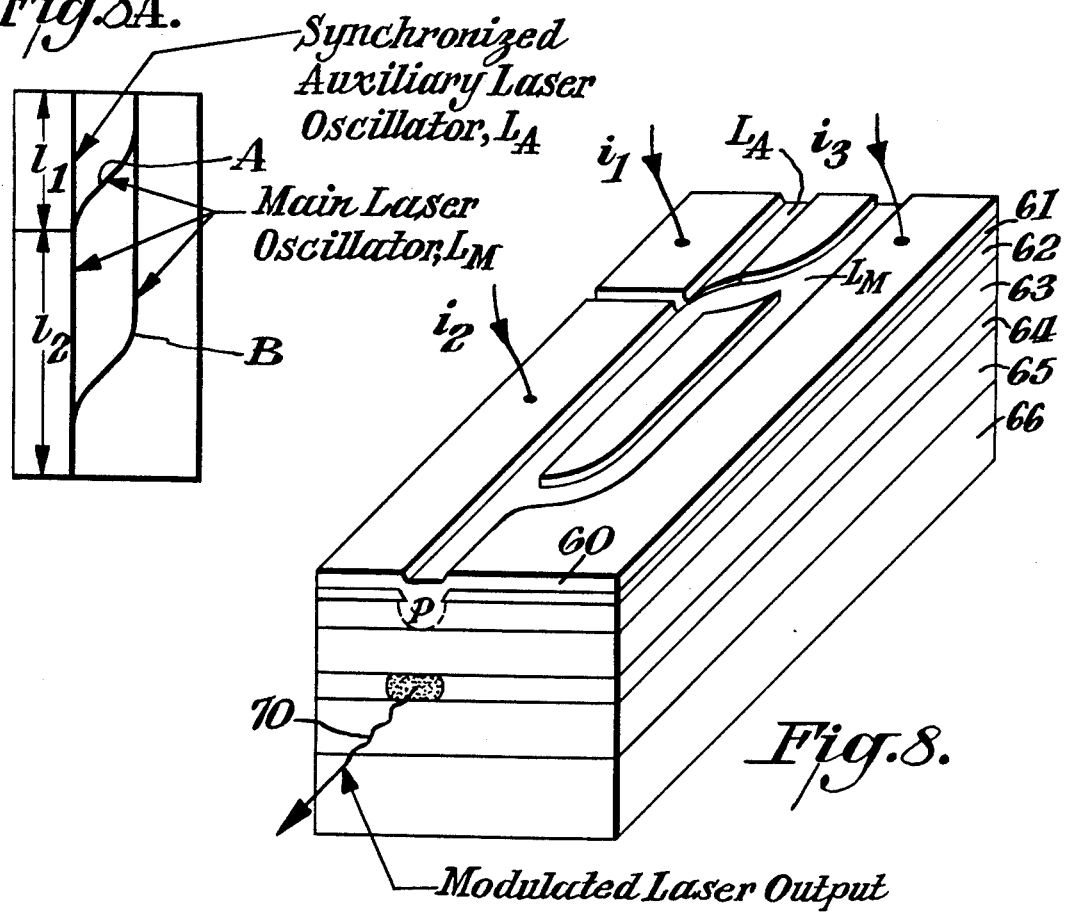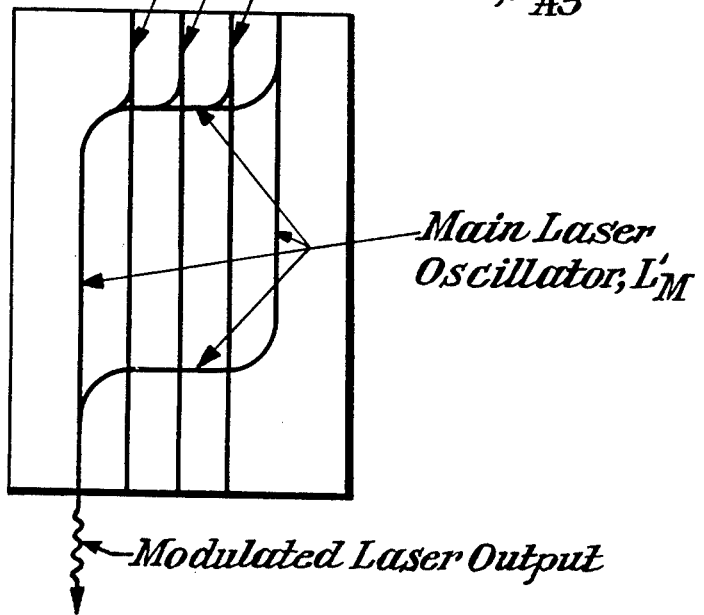

METHOD AND APPARATUS FOR SIGNAL TRANSMISSION VIA AN OPTICAL FIBER

BACKGROUND OF THE INVENTION

Information transmission via an optical fiber transmission line has quite recently been found practicable. It is theoretically possible that a single optical fiber transmission line of a diameter not much larger than a human hair, i.e., 0.025–0.125 mm, corresponding to 0.001"–0.005", has several times the information capacity for carrying all of the television channels from channel #2 through channel #83 inclusive, plus the whole of FM broadcasting, corresponding to a bandwidth of nearly one billion cycles per second (1 GHz).

However, conventional AM or digital (time-division multiplexing) methods cannot efficiently utilize such a large information capacity. A great majority of known experiments with wide band and multiple channel transmission reported in the literature have up until now utilized digital techniques.

While digital techniques have their own unique advantages, the bandwidth requirement therefore is relatively enormous. Thus, for example, a standard TV signal with a signal bandwidth of 6.0 MHz requires an 88 mega bits digital signal to transmit. This is equivalent to a signal bandwidth of more than 200 MHz, corresponding to a bandwidth utilization efficiency of only about 3%.

The standard AM (amplitude modulation) creates two sidebands. If FDM (Frequency Division Multiplexing) is used on AM, the bandwidth requirement increases rapidly as more information bands are added. In addition, because of the non-linearity of the optical detector, intermodulation between bands becomes a very serious problem. Therefore, the standard AM cannot be efficiently transmitted in optical fiber communication. Also, at the present time, standard FM (Frequency Modulation) cannot be easily implemented in optical fiber transmission.

Standard SSB (Single-Side-Band) transmission is known to have a very high efficiency in utilizing the bandwidth. However, conventional SSB techniques used in radio frequency (up to microwaves) cannot be conveniently used at optical (visible, infrared, ultraviolet) frequencies.

SUMMARY OF THE INVENTION

This invention constitutes a method and apparatus for facilitated signal transmission in the optical frequency region. In this regard, it will be understood that optical frequencies as referred to in this disclosure extend far outside of the visible spectrum, which is approximately 0.38–0.75 μM.

The practice of this invention involves the use of two or more substantially monochromatic optical beams having their frequencies interlocked to a preselected degree dependent upon the transmission service to be effected, one beam being reserved as a carrier (or reference) whereas the other beams are reserved as individual information beams upon which individual electrical signals to be transmitted are modulated.

In one optical embodiment of this invention, the information beams of preselected frequency are derived by frequency-shifting a portion of the radiation from a single laser radiation source to a new preselected frequency utilizing an acousto-optic modulator, the frequency shift typically being of the order of several tens of MHz to several GHz. Here the frequency shifting is effected by either generating within, or injecting a subcarrier frequency $f_1$, via the acousto-optic modulator. The subcarrier can conveniently be simultaneously utilized as the input vehicle for the electrical signal to be transmitted by modulation thereon, which now can readily be in any of the modes AM, DSB, SSB, FM or PM, which is entirely practicable at the subcarrier frequencies employed without incurring the limitations imposed by the optical frequencies per se. On the other hand, in the monolithic laser embodiments of this invention, where two coupled lasers are used and therefore no subcarrier is needed for the electrical signal input, the present state of the art limits signal transmission to the AM and FM modes.

Signal processing in the optical embodiments can be described as follows.

Let the first signal to be transmitted be represented by $S_1'$ and the actual transmitted signal or the modulated signal by $S_1 = S_1' \text{Ⓜ} f_1$ wherein Ⓜ represents modulation, which can be by any of the methods hereinbefore mentioned.

The modulated signal $S_1$ is then frequency-shifted to $\nu_0\{\pm\} S_1 \text{Ⓜ} f_1$ wherein the plus sign refers to up-shift and the minus sign to down-shift, either of which works equally well. However, for simplicity hereinafter, this description is made in terms of up-shifting the signal exclusively.

The up-shift is mathematically equivalent to changing $S_1$ to $S(\nu_0) = a_1 S_1 e^{i\nu_0 t}$, where $a_1$ is an arbitrary constant. Then, the second signal is represented by $S_2'$, and the modulated and up-shifted signal by $S_2 = S_2' \text{Ⓜ} f_2$ and $S_2(\nu_0) = a_2 S_2 e^{i\nu_0 t}$. Similarly, there can be other signals in a sequence $S_3(\nu_0) \ldots S_n(\nu_0)$, so that the entire signal train can be represented by:

$$S = a_1 S_1 e^{i\nu_0 t} + a_2 S_2 e^{i\nu_0 t} \ldots + a_n S_n e^{i\nu_0 t}$$
$$= (a_1 S_1 + a_2 S_2 \ldots + a_n S_n) e^{i\nu_0 t}$$

The degree of frequency interlock between the carrier radiation beam and information radiation beams is dependent upon the transmission service to be effected. Typically, for FM transmission the degree of frequency interlock should be about 10 kHz, for television transmission about 1 MHz and for telephone conversation about 100 Hz. Also, as examples, typical subcarrier frequencies $f_1$ can be 54 MHz for TV, 88 MHz for FM and 110 MHz for telephone signal input with accompanying frequency shifting.

DRAWINGS

The following schematic representations illustrate applicable principles together with several embodiments of this invention, in which:

FIG. 1 is a typical spectrum distribution applicable to this invention,

FIG. 2 is a spectrum distribution of a typical PAM (Pulse Amplitude Modulation) digital transmission for comparison with FIG. 1, FIG. 3 is a representation of a first embodiment of optical apparatus according to this invention, FIG. 4 is a representation of a second embodiment of optical apparatus according to this invention, FIG. 5 is a representation of a third embodiment of optical apparatus according to this invention, FIG. 6 is a detail of apparatus adapted to transmit a multiplicity of different signals, thereby achieving very wide band transmission. The information beam input to the modulator here can be either of the embodiments of FIGS. 3 or 4.

FIG. 7 is a perspective representation of a typical optical embodiment using integrated optics technology in the radiation handling apparatus according to this invention, FIG. 8 is a perspective representation of an integrated optics embodiment using a monolithic laser according to this invention, FIG. 8A is a schematic plan view of the laser of FIG. 8 showing general relative proportions of the principal components, and FIG. 9 is a schematic plan view of a monolithic laser embodiment of apparatus adapted to transmit simultaneously a multiplicity of signals according to this invention.

DETAILED DESCRIPTION

Figure 5:
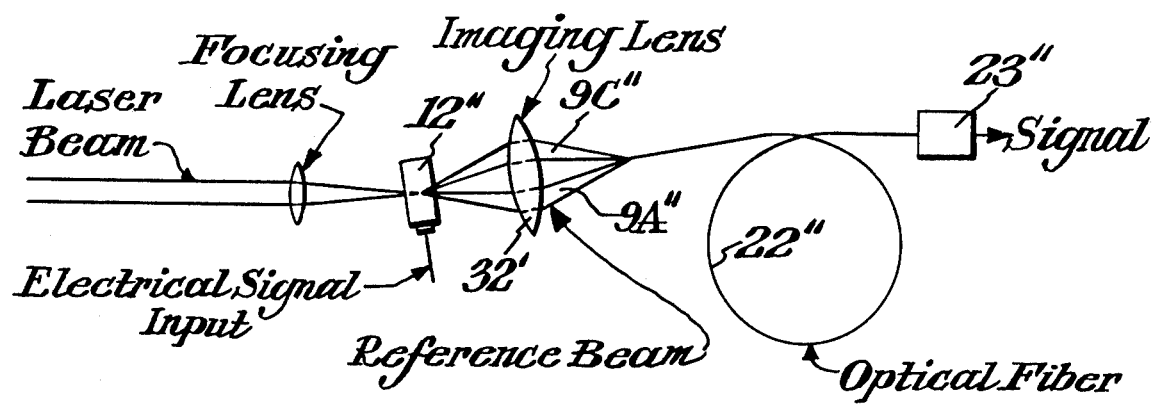

Referring to FIG. 3, a preferred optical embodiment of this invention employs a laser as radiation source 10, which latter can typically be a conventional gas, solid state or semiconductor injection type (for example, a He-Ne laser, a glass or Yag laser, or a GaAlAs laser diode).

The laser beam 9 output from laser 10 is directed to a first (commercially available) beam splitter 11, which reflects a fraction of the radiation to conventional mirror 15, thereby establishing a carrier or reference radiation beam 9A which passes to a recombining beam splitter 16.

Simultaneously, the remaining laser radiation is transmitted by beam splitter 11 as beam 9B which is directed to an acousto-optic modulator 12, typically, a glass, $PbMoO_4$ or $TeO_2$ acousto-optic modulator, to which the electrical signal to be transmitted is supplied as input 24. This electrical signal consists of a subcarrier frequency f, upon which information to be transmitted is modulated. (In this connection, the subcarrier can be provided by a conventional oscillator, now shown, assembled integrally with acousto-optic modulator 12, or, optionally, the subcarrier can be supplied from any conventional outside source, not detailed, whereupon the electrical signal input can be modulated on the subcarrier before it is introduced into modulator 12.)

The modulated output 9C of acousto-optical modulator 12, hereinafter referred to as the information radiation beam, is directed to mirror 25 and is thence reflected to beam splitter 16 wherein it merges with beam 9A, so that the combined radiation output passes, as beam 9D, to coupler 19, which may typically be a microscope objective or equivalent device which introduces the combined radiation to optical fiber 22, typically a commercially available low loss optical fiber.

Optical detector and demodulator 23, typically a commercially available high speed photo diode, is a conventional square law detector, responding only to the power (or energy) of the received signal, which produces the "beat" between the modulated information signal 9C and the carrier signal 9A, thereby automatically recovering and demodulating the electrical signal input 24.

By including carrier 9A with the signal 9C, which latter is essentially Single Side Band (SSB), the following important advantages are obtained:

1. Since the carrier 9A serves as a reference wave, it is practicable to accommodate the equivalent SSB systems at optical frequencies.

2. When the carrier (or reference) wave 9A is preselected to be much stronger than the information signal 9C, modulator 12 and detector 19 non-linearity is minimized.

3. When the subcarrier frequency $f_1, f_2 \ldots f_n$ is chosen sufficiently high, the intermodulation-induced noise is minimized.

4. The bandwidth limitation of optical fibers is principally due to the dispersion, i.e., the speed of propagation of the optical wave through the optical fiber is different for different modes and/or frequencies. Normally, a broad band signal is composed of many small bandwidth signals, such as multiple TV or telephone conversation channels. When a digital system is used to transmit these signals, using the time-division multiplexing method, all of the bands or channels are mixed together. This mixing requires a communication system having an information bandwidth at least, but usually much larger, than the summation of the combined channel bandwidths. The dispersion, which is a monotonic increasing function of the bandwidth, becomes very severe as a result of the great span of bandwidth.

The method of this invention maintains the identity of each information channel. Since the carrier wave, or reference, 9A, is nearly a single frequency, the relative phase shift between wave 9A and individual information bands 9C is far less critical. In this invention, the dispersion of most concern is that incident to the bandwidth of individual information bandwidths. Individual channel bandwidths are usually very small, e.g., a standard TV channel requires only 6 MHz, and a telephone conversation channel only 5 kHz. The effect of the dispersion for large bandwidth transmission is therefore largely avoided, because, now, the bandwidths of individual signals are independent and small. Thus, assuming that the dispersion is linearly proportionate to the bandwidth, at 6 MHz, the dispersion is only 6/200=0.03, or only 3.0 percent of that corresponding to a digital transmission. In addition, there is no theoretical limit with regard to how many channels can be sent through an optical fiber using the present invention.

Figure 6:
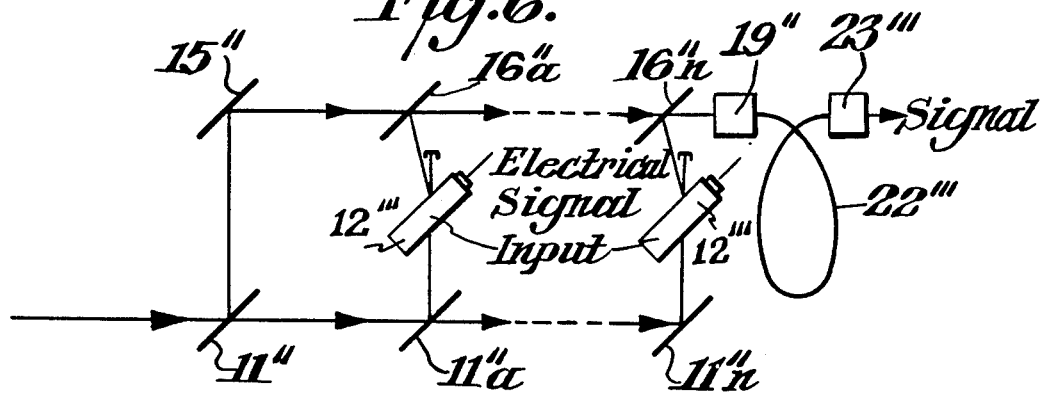

It will be understood that, as shown in FIG. 6, a single carrier or reference radiation and a multiplicity of modulated information waves, each provided with its own acousto-optic modulator 12''' all recombining with the carrier via beam splitters 16''a,-16''n and thence transmitted through 19'' and optical fiber 22''' to the destination point, can be used to further increase the useful information bandwidth. The comparative frequency spectrum distribution of this invention and conventional AM modulation (i.e., PAM, or Pulse-Amplitude Modulation can be considered to be standard AM) are shown in FIGS. 1 and 2, respectively.

5. Since the signal channel is conventionally shifted away from the reference wave, this invention can be made directly compatible with standard TV frequency spectrum assignment. For example, if the first subcarrier frequency is 54 MHz, the first channel will be identical to the commercial TV Channel #2. Using this assignment, the entire TV channel spectrum, i.e., Channels #2-#13 and #14-#83, together with the complete FM broadcasting, can be transmitted via a single optical fiber using a single carrier wave 9A. There need only be incorporated a high frequency light detector 23 with the standard TV and FM receivers to receive the transmitted signals.

6. Signal channels originated by AM, FM or other types of modulations on the subcarrier can be effectively used according to this invention.

As hereinbefore stated, the information deterioration in propagating through an optical fiber transmission line 22 over a long distance depends only on the individual information bandwidth, and not on the total bandwidth, as in the case for a digital system. As an example, a standard TV channel requires an information bandwidth of 6 MHz. Using this invention, the information bandwidth passing through optical fiber line 22 is the same 6 MHz.

By way of comparison, a recent Canadian experiment reported in The Society of Photo-Optical Instrumentation Engineers' Technical Symposium East 1978, Washington, D.C., March 28-31, 1978, papers 139-10 and 139-11 in multiple video channel transmission via a single optical fiber line used a 320 Mega Bit/sec. digital system to carry the equivalent of only three TV channels. Thus, the information bandwidth was equivalent to nearly 1 GHz (i.e., 3×320, as a conservative estimate). Therefore, in comparison, this invention effects a signal deterioration of only 6/1000=1/167 that of a digital system. Stated in other terms, the method of this invention enables a TV signal to travel 167 times the distance of that for a conventional 3-channel digital system characterized by the same amount of signal deterioration. This advantage is, of course, in addition to the fact that far more channels can be carried by the invention system.

The information bandwidth of the configuration shown in FIG. 3 can be objectionably limited for some service. Accordingly, there is provided a second optical embodiment of this invention such as shown in FIG. 4 which has, potentially, a much higher information bandwidth.

The greater bandwidth of laser beam 9' in the apparatus of FIG. 4, is due to the fact that, in order for the acousto-optic modulator 12' to work properly, the input ray 9' and the output ray 9B' must make equal angles with the wavefront of the acoustic wave in the acousto-optic modulator 12'. This is denoted the Bragg diffraction condition.

The angle is related to the frequency of the acoustical wavelength, which is the same as the input electrical signal. In fact, the angle is a monotonic increasing function of the frequency of the input signal.

To obtain enhanced intensity, radiation 9B' is brought to a focus by interposing thereacross a focussing lens 28 which is convergent, either cylindrically—one dimensional, or spherically—two dimensional, different rays making different angles with respect to the acoustical wave front. Therefore, different portions of the input rays 9B' satisfy the Bragg condition with different frequency components in the input signal. Thus, by making the input beam 9B' convergent, a substantially larger information bandwidth is effectively achieved, because the information represented by different frequencies is, in fact, transmitted at different locations on the laser beam. Necessarily, the information beam 9C' has to be re-collimated after clearing acousto-optic modulator 12', and this is effected by collimating lens 29.

FIG. 5 details a third embodiment of the apparatus of this invention which is an alternative to that of FIG. 4 and appreciably more simple in design, in that it employs a single imaging lens 32' after acousto-optical modulator 12", thereby simultaneously resolving the radiation into information beam 9C" and carrier beam 9A".

EXAMPLE

An apparatus was constructed in accordance with FIG. 3 wherein laser 10 was a He-Ne type emitting radiation at 632.8 nm wavelength.

Acousto-optic modulator 12 was an AOM-125 acousto-optic modulator marketed by IntraAction Corporation to which a standard FM signal was applied as signal 24 via a subcarrier at 90 MHz, input power approximately 2 watts.

Optical fiber transmission line 22 measured ~0.003" in diameter and had a length of 20 meters.

High frequency light detector 23 was incorporated in a standard FM receiver. Signal reception via detector 23 was excellent.

For multiple channel transmission, it is preferred to use apparatus detailed in FIG. 4 wherein all components are of the types hereinabove detailed for the Example, input signals typically constituting TV channels Nos. 2, 4 and 6 being introduced at 24'.

In another equipment assembly using an ADM-80 acousto-optic modulator, standard TV channels 3 and 6 were successfully transmitted via a one kilometer optical fiber transmission line measuring ~0.003".

Figure 7:
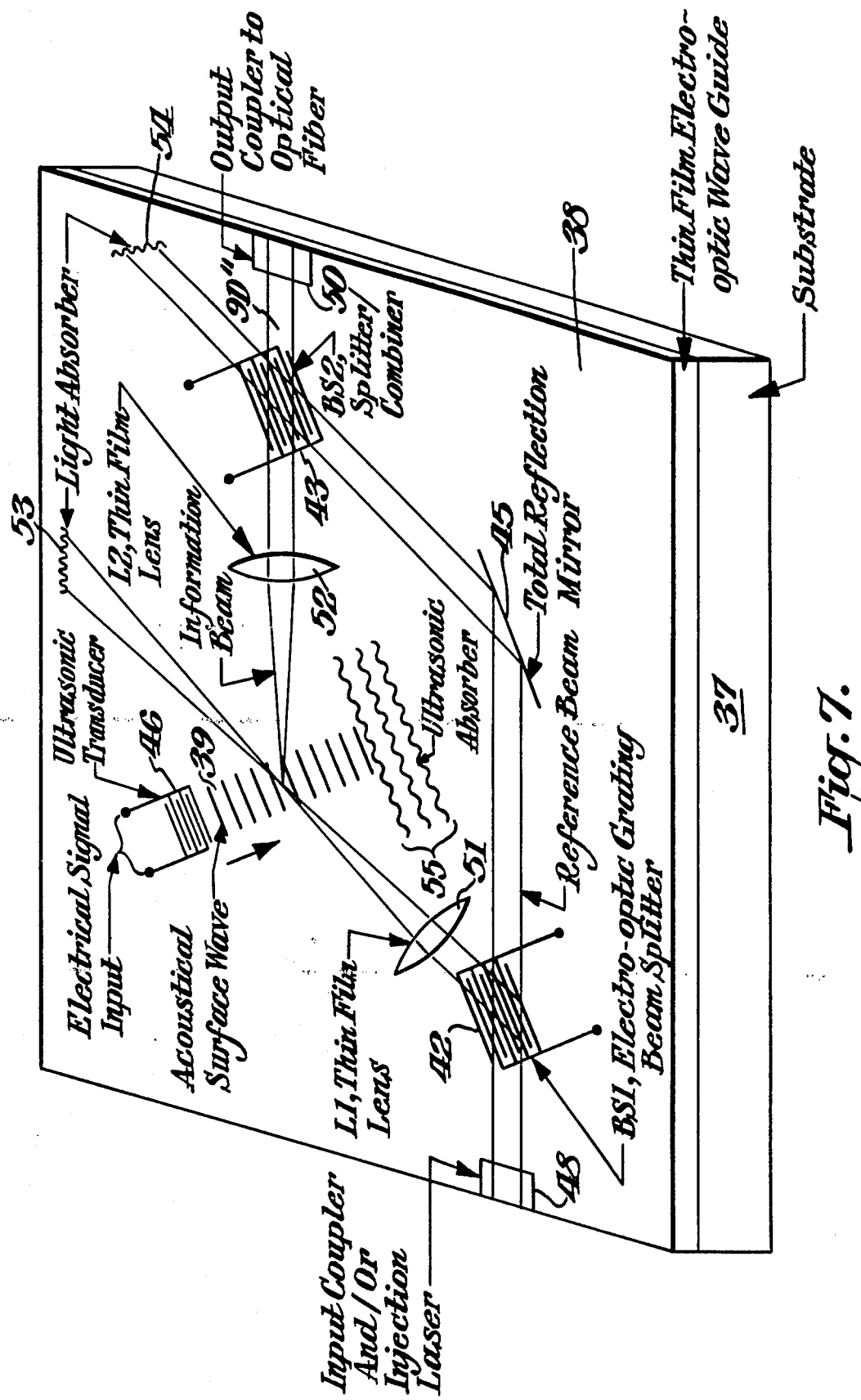

Referring now to FIG. 7, it is practicable to fabricate an optical embodiment of this invention matching that of FIG. 4 using available integrated optics technology, reducing the overall size to several mm x several mm.

Here, substrate 37, typically several tenths of a mm thick, is an electro-optic active crystal, such as LiNbO$_3$ or LiTaO$_3$. The thin layer electro-optic waveguide 38, typically several micrometers thick, is formed by either out-diffusion (in the case of LiNbO$_3$), or in-diffusion (in the case of LiTaO$_3$), all as taught in *Integrated Optics*, edited by T. Tamir, "Topics in Applied Physics", Vol. 7, Springer-Verlag (1975) and references cited therein.

It will be noted in FIG. 7 that the arrangement of components is closely similar to that of FIG. 4; however, the acoustical surface wave 39 serves both as a frequency shifter and a mirror, thereby eliminating a mirror counterpart for 25', FIG. 4.

Beam splitters 42 and 43 are of the electro-optic grating type wherein the ratio of transmitted and reflected radiation can be controlled by the d-c voltage applied to the electrodes. If desired, other known types of directional couplers can be substituted.

A total relection mirror 45 is shown in FIG. 7; however an electro-optic grating beam modulator/switch/-splitter can be substituted when it is biased to its maximum efficiency.

In the FIG. 7 embodiment, the acousto-optic modulator 46 is fabricated directly on electro-optic wave guide 38 by depositing an interdigital—finger electrode on top of the waveguide as taught in *Integrated Optics* supra, supplemented by the literature reference *Guided-Wave Acousto-Optic Fundamentals and Wideband Applications*, by Chen S. Tsai, Proceedings of the Society of Photo-Optical Instrumentation Engineers, Vol. 139 (1978).

The laser beam is coupled to waveguide 38 by a suitable coupler 48, such as a prism or grating coupler, and a similar coupler 50 is employed to couple the output 9D" into the optical fiber transmission line (not shown in FIG. 7). If a semiconductor injection laser is employed as the radiation source, the laser can be mounted directly on substrate 37, with beam coupled to waveguide 38 as taught in the literature reference, *Parallel Endbutt Coupling for Optical Integrated Circuits* by R. G. Hunsperger, A. Yariv and A. Lee, p. 1026, Applied Optics, April 1977.

Focusing lens 51 can be formed by depositing a thin film of high refractive index material in place of the electro-optical waveguide 38 material. For example, if waveguide 38 is $LiNb_xTa_{1-x}O_3$, the lens is formed by simply increasing the Nb concentration. Alternatively, if the lens is fabricated from material of lower refractive index, the lens should be shaped as a concave lens. Still another design can be a deposited electrode in the shape of a lens. Then, by choosing a proper orientation of substrate 37, such as a Y-out crystal of $LiNbO_3$ or $LiTaO_3$, and by applying a suitable voltage to the electrode, the index of refraction under the electrode can be changed selectively, thereby obtaining lens focusing action. An advantage of the electrode lens is that the refractive index can be changed at will by appropriate adjustment of the applied voltage, thereby permitting selective change of the focal length of the lens. A disadvantage of this design is that the focal length of the lens is dependent on the polarization of the wave in the waveguide. This disadvantage is not, however, a very serious one, since the polarizations in waveguide 38 can be readily controlled. Also if desired, lens 51 can be formed by using a combination of the several techniques hereinbefore described.

Collimating lens 52, interposed in the information beam path, FIG. 7, can be fabricated by any of the methods herein before taught for focusing lens 51.

It is desirable to back-stop any radiation not utilized in the information and radiation beams, and this is accomplished by simply grooving waveguide 38 at region 53 at the end of the beam path in prolongation with lens 51 and also at region 54 in line with the non-combined radiation from beam splitter 43. Similarly, it is desirable to stop the acoustical surface wave by similar grooving etched into the substrate at region 55.

Another embodiment of integrated-optics design which can be employed with this invention is that detailed in FIGS. 8 and 8A. Here the carrier (reference) radiation and the information radiation frequencies, with the necessary frequency interlock, are generated simultaneously by two coupled semiconductor double-heterostructure lasers of monolithic construction. The satisfactory operation of such coupled lasers has been demonstrated as described by D. R. Scrifres, W. Strifer and R. D. Bainham in the reference, *Beam Scanning and Wavelength Modulation with Branching Wave Guide Strip Injection Lasers*, Applied Physics Letters, 33, (7), Oct. 1, 1978.

Referring to FIG. 8, a typical monolithic structure can consist of the seven layer sandwich made up of the following:

| Layer Reference | Composition |
|---|---|
| 60 | Au superimposed on Cr |
| 61 | $Si_3N_4$ |
| 62 | n-GaAs |
| 63 | $p-Ga_{0.6}Al_{0.4}As$ |
| 64 | $p-Ga_{0.95}Al_{0.05}As$ |
| 65 | $n-Ga_{0.6}Al_{0.4}As$ |
| 66 | n-GaAs |

The main laser oscillator, denoted generally as $L_M$, FIGS. 8 and 8A, consists of two major branches in a looped configuration, and is pumped strongly. The auxiliary laser oscillator, $L_A$, consists of a straight strip which shares a part of a branch of the main laser, $L_M$, and is pumped slightly above the threshold for lasing action for the section $l_1$. Accordingly, main laser $L_M$ is much stronger than $L_A$ and its characteristics determine its oscillation frequency.

Because of the physical coupling between $L_M$ and $L_A$, the oscillation frequency $f_A$ of $L_A$ is locked into the oscillation frequency $f_M$ of $L_M$ but is forced to oscillate at a frequency different from $L_M$ by preselection of its own driving current $i_1$. Main oscillator $L_M$ is driven by current inputs $i_2$ and $i_3$.

The laser beam output 70 consists of two distinct frequencies, one being that of $L_M$ and the other being that of $L_A$. Because of the coupling between the two, these frequencies track each other. When pumping current $i_1$ for $L_A$ is changed, $f_A$ changes relative to $f_M$. However, since $L_M$ is much stronger than $L_A$, $f_M$ remains substantially unchanged. In fact, even if $f_M$ does change, as long as $f_M$ and $f_A$ track each other, the change of $f_M$ does not affect invention operation.

If an electrical signal (without subcarriers) to be transmitted is superimposed on $i_1$, the frequency of $f_A$ (and also its amplitude) is correspondingly modulated. Then the laser output consists of a carrier (or reference) frequency, $f_M$, and an information frequency, which is $f_A$ modulated by the electrical input signal. Thus, the entire operation of the relatively complicated electro-optical embodiments of FIGS. 3–7 is accomplished directly by the branched injection laser of FIGS. 8 and 8A with great economies of space and size.

For good operation, the bias current $i_1$ for $L_A$ must be controlled so that the average $|f_M-f_A|$ is maintained substantially constant, and this can be achieved with conventional frequency stabilizers. Also, the two branches of $L_M$, i.e., the branch denoted $l_2$ plus the upper curved portion A, and the branch denoted B, should be electrically "separated" so that the pumping current for each branch (i.e., $i_2$ and $i_3$, respectively) can be individually adjusted to obtain a single frequency output for $L_M$.

The modulation of $f_A$ is both AM and FM, under which conditions the use of a limiter at the reception point to remove the AM part of the signal, while retaining the FM, is preferred for most reliable service.

The embodiment of FIGS. 8 and 8A utilizes only one information beam, however, the monolithic design of FIG. 9 is suited to multiple simultaneous signal transmission. Here the main laser oscillator $L_M'$ is expanded to include two horizontal branches, whereas the auxiliary lasers $L_{A1}$, $L_{A2}$ and $L_{A3}$ each consist of a straight strip coupled to the main laser at an individual one of the horizontal branches. While only three auxiliary lasers are shown, a greater number can be provided if required.

Auxiliary lasers $L_{A1}$, $L_{A2}$, $L_{A3}$ ... $L_{An}$ are separately biased (not shown), so that each oscillates at a different characteristic frequency relative to main laser $L_M'$, thereby establishing a multiplicity of information radiations with respect to the reference frequency, $f_M$, of the main laser $L_M'$. In service the pumping current of each auxiliary laser is modulated from an individual information source, thereby accomplishing multichannel signal transmission.

What is claimed is:

1. A method of signal transmission via an optical fiber transmission line comprising providing a first substantially monochromatic beam of radiation reserved as a carrier radiation beam, providing a second substantially monochromatic beam of radiation frequency-interlocked with said first beam of radiation to a preselected degree dependent upon the transmission service to be effected reserved as an information radiation beam, imposing an electrical signal to be transmitted upon said information radiation beam, thereby responsively modulating said information radiation beam, combining said carrier radiation beam and said modulated information radiation beam, transmitting said combined radiation via said optical fiber transmission line to a preselected destination, and detecting said combined radiation with a square law detector to thereby obtain a subcarrier signal constituting the difference in frequency between said carrier radiation beam and said information beam upon which said electrical signal is modulated as the beat frequency of said carrier radiation beam and said information radiation beam, and demodulating to reconstitute said original electrical signal.

2. A method of signal transmission via an optical fiber transmission line according to claim 1 wherein said first and said second substantially monochromatic beams of radiation are laser radiation outputs.

3. A method of signal transmission via an optical fiber transmission line according to claim 1 wherein there is provided a multiplicity of second substantially monochromatic beams of radiation each frequency-interlocked with said first beam of radiation to a preselected degree dependent upon the transmission service to be effected and each reserved as an individual information radiation beam, imposing an electrical signal to be transmitted upon each said information radiation beam, thereby responsively modulating said information radiation beam, combining said carrier radiation beam with said modulated information radiation beams in turn, transmitting said combined radiation via said optical fiber transmission line to a preselected destination, detecting said combined radiation with a square law detector to thereby obtain subcarrier signals constituting the difference in frequency between said carrier radiation beam and said each associated individual information radiation beam upon which said electrical signal is modulated as the beat frequencies of said carrier radiation beam and said each modulated information radiation beam, and demodulating to reconstitute said original electrical signals.

4. Apparatus for signal transmission via an optical fiber transmission line comprising means providing a first substantially monochromatic beam of radiation reserved as a carrier radiation beam, means providing a second substantially monochromatic beam of radiation frequency-interlocked with said first beam of radiation to a preselected degree dependent upon the transmission service to be effected reserved as an information radiation beam, means imposing an electrical signal to be transmitted upon said information radiation beam, thereby responsively modulating said information radiation beam, means combining said carrier radiation beam and said modulated information radiation beam and delivering said combined radiation to an optical fiber transmission line transmitting said combined radiation to a preselected destination, and a square law detector at said preselected destination transducing said combined radiation to thereby obtain a subcarrier signal constituting the difference in frequency between said carrier radiation beam and said information radiation beam upon which said electrical signal is modulated as the beat frequency of said carrier radiation beam and said information radiation beam, and demodulation means reconstituting said original electrical signal.

5. Apparatus for signal transmission via an optical fiber transmission line according to claim 4 wherein said means providing said first substantially monochromatic beam of radiation reserved as said carrier radiation beam and said means providing said second substantially monochromatic beam of radiation reserved as said information radiation beam are both lasers.

6. Apparatus for signal transmission according to claim 4 wherein there is utilized a single laser as the source of substantially monochromatic radiation in conjunction with a beam splitter establishing said carrier radiation beam as a first preselected fraction of said laser output radiation and a second preselected fraction, an acousto-optic modulator frequency-shifting said second preselected radiation fraction to a preselected different frequency than said carrier radiation beam, thereby establishing said information radiation beam, and means imposing said electrical signal to be transmitted via said acousto-optic modulator upon said information radiation beam, thereby responsively modulating said information radiation beam.

7. Apparatus for signal transmission via an optical fiber transmission line according to claim 4 wherein there is employed a multiplicity of means providing individual information beams, each at a preselected different frequency than said carrier radiation beam and each provided with means imposing an individual electrical signal to be transmitted thereon, in conjunction with a single means defining said carrier radiation beam to thereby transmit a plurality of signals at different preselected frequencies over a single optical fiber transmission line.

8. Apparatus for signal transmission according to claim 6 wherein said acousto-optic modulator incorporates an oscillator capable of being modulated by an electrical signal to be transmitted effecting said frequency-shifting of said second preselected radiation fraction to said preselected different frequency than said carrier radiation beam.

9. Apparatus for signal transmission according to claim 6 wherein said frequency-shifting of said second preselected radiation fraction to said preselected different frequency than said carrier radiation beam is effected via said acousto-optic modulator by oscillator means external of said modulator generating a subcarrier upon which said electrical signal to be transmitted is first modulated.

10. Apparatus for signal transmission according to claim 6 provided with means bringing said second preselected radiation fraction into substantial focus in the central modulation region of said acousto-optic modulator followed by means collimating said modulated information radiation beam prior to combining said carrier radiation beam and said modulated information radiation beam.

11. Apparatus for signal transmission according to claim 4 wherein said means providing said first substantially monochromatic beam of radiation reserved as a carrier radiation beam and said means providing said second substantially monochromatic beam of radiation frequency-interlocked with said first beam of radiation are two separate but coupled lasers and said electrical signal to be transmitted is imposed upon the driving current applied to a preselected one of said lasers.

12. Apparatus for signal transmission according to claim 11 wherein said coupled lasers are semiconductor injection lasers.

13. Apparatus for signal transmission according to claim 4 wherein said means providing said first substantially monochromatic beam of radiation reserved as a carrier radiation beam and said means providing said second substantially monochromatic beam of radiation frequency-interlocked with said first beam of radiation is a unitary monolithic structure embodying a first laser generating said first beam and a second laser generating said second beam, and means imposing said electrical signal to be transmitted upon the driving current of said second laser, whereby said carrier radiation beam and said modulated information radiation beam are combined internally of said monolithic structure.

14. Apparatus for signal transmission via an optical transmission line according to claim 13 wherein said unitary monolithic structure embodying said first laser generating said first beam incorporates a multiplicity of lasers generating individual information beams, each at a preselected different frequency than said first beam and each provided with means imposing an individual electrical signal to be transmitted upon the driving current thereof, whereby said carrier radiation beam and said modulated radiation beams are combined internally of said monolithic structure to thereby transmit a plurality of signals at different preselected frequencies over a single optical fiber transmission line.

* * * * *